United States Patent [19]

Katsuoka et al.

[11] Patent Number: 4,973,377
[45] Date of Patent: Nov. 27, 1990

[54] CRYSTAL DIAMETER CONTROLLING METHOD

[75] Inventors: Nobuo Katsuoka, Takasaki; Yoshihiro Hirano; Atsushi Ozaki, both of Annaka, all of Japan

[73] Assignee: Shin-Etsu Handotai Company, Ltd., Tokyo, Japan

[21] Appl. No.: 174,583

[22] Filed: Mar. 28, 1988

[30] Foreign Application Priority Data

Mar. 31, 1987 [JP] Japan .................................. 62-78387

[51] Int. Cl.⁵ ............................................. C30B 15/22
[52] U.S. Cl. .................................. 156/601; 156/618.1
[58] Field of Search .................. 156/601, 617.1, 618.1, 156/619.1

[56] References Cited

U.S. PATENT DOCUMENTS 4,710,258 12/1987 Latka .................................. 156/617.1
4,794,263 12/1988 Katsuoka et al. .................... 156/601

FOREIGN PATENT DOCUMENTS 115121 8/1984 European Pat. Off. .
116189 7/1984 Japan .................................... 156/601

OTHER PUBLICATIONS

Patzner et al., *SCP and Solid State Technology*, pp. 25-30, Oct. 1967.

*Primary Examiner*—Melvyn J. Andrews
*Attorney, Agent, or Firm*—Browdy and Neimark

[57] ABSTRACT

Disclosed is a method of controlling the diameter of a single crystal produced by the Czochralski method. The diameter of a tapered portion of the single crystal is controlled by controlling the temperature of a melt in a crucible and the rotational speed of the crucible. The control range of the rotational speed of the crucible is made narrower as the diameter of the tapered portion approaches closer to that of a body portion, and the rotational speed is made constant while the body portion is grown.

7 Claims, 3 Drawing Sheets

CRYSTAL DIAMETER CONTROLLING METHOD

BACKGROUND OF THE INVENTION

1. Field of the Invention:

The present invention relates to a method of growing semiconductor crystals, such as, for example, silicon or germanium crystals for use in the manufacture of semiconductor components and manufactured by the Czochralski method, and, more particularly, to a method of automatically controlling the diameter of such crystals to get a predetermined shape in the region from after making of seed through shouldering to a constant diameter of the body using a combination of new parameters and adjusting these parameters.

2. Description of the Prior Art:

The Czochralski method of crystal growing is well known and various schemes are available in the prior art for controlling the diameter of the crystal to desired values during the solidification both in the stages of shoulder and body. Such diameter control schemes have been of the closed loops variety and it has been well known to use an electrooptical system, for example. In a conventional method, while the temperature profile in the melt is kept constant, a crystal diameter related offset signal is supplied to a motor control means for the motor to pull the crystal at a desired diameter. The adjustment of the pulling velocity has adverse effects on the crystallinity of the resulting crystal, such as dislocations generated at the peripheral portion. In another conventional method, the diameter is controlled solely by way of adjusting the temperature profile to enlarge or lessen it through change in the power supplied to the surrounding heating means. Generally, the heat capacity of the melt is too large to allow temperature profile to be finely changed to a proper extent and with quick response, and diameter control is therefore unsuccessful in practical terms.

SUMMARY OF THE INVENTION

In view of the above-described problems of the prior art, an object of the present invention is to provide a method of controlling the diameter of a crystal which ensures quick response and highly stable control and yet does not cause crystal defects such as dislocations.

To attain this object, the present invention provides a method of controlling the diameter of a crystal produced by the Czochralski method which comprises the step of controlling the diameter of a tapered portion of the single crystal by controlling the temperature of a melt contained in a crucible and the rotational speed of the crucible, the control range of the rotational speed of the crucible being made narrower as the diameter of the tapered portion gets closer to that of a body, and the rotational speed of the crucible being made constant just past the start of the body growing.

Since the diameter of the crystal is more effectively controlled, especially with a small diameter, by the rotational speed of the crucible, as compared with a case wherein the temperature of the melt is adjusted, the rotational speed of the crucible can be used advantageously to control the crystal diameter in a tapered portion of the crystal growing without causing any adverse effect in terms of generation of dislocation or other crystallographic defects that are commonly experienced with the conventional pulling method for the diameter control.

The diameter control technique according to the present invention can be applied to the body—not being limited to the tapered portion only. But the body represents a part used in semiconductor component manufacturing and, therefore, the crystallinity is not the only critical factor of the quality and other qualitites such as oxygen contents and resistivity or a dopant level need to be controlled at predetermined values. These special requirements assigned to the body limit the present invention to the tapered portion alone. The smooth and gradual transition from a tapered portion to a body of the rotational speed of a crucible will prevent any undesirable phenomena, for instance, polycrystallization, deformation of a crystal or the like, from manifesting.

DESCRIPTION OF THE PREFERRED EMBODIMENT

An embodiment of the present invention will be described below in detail with reference to the accompanying drawings.

Figure 1:
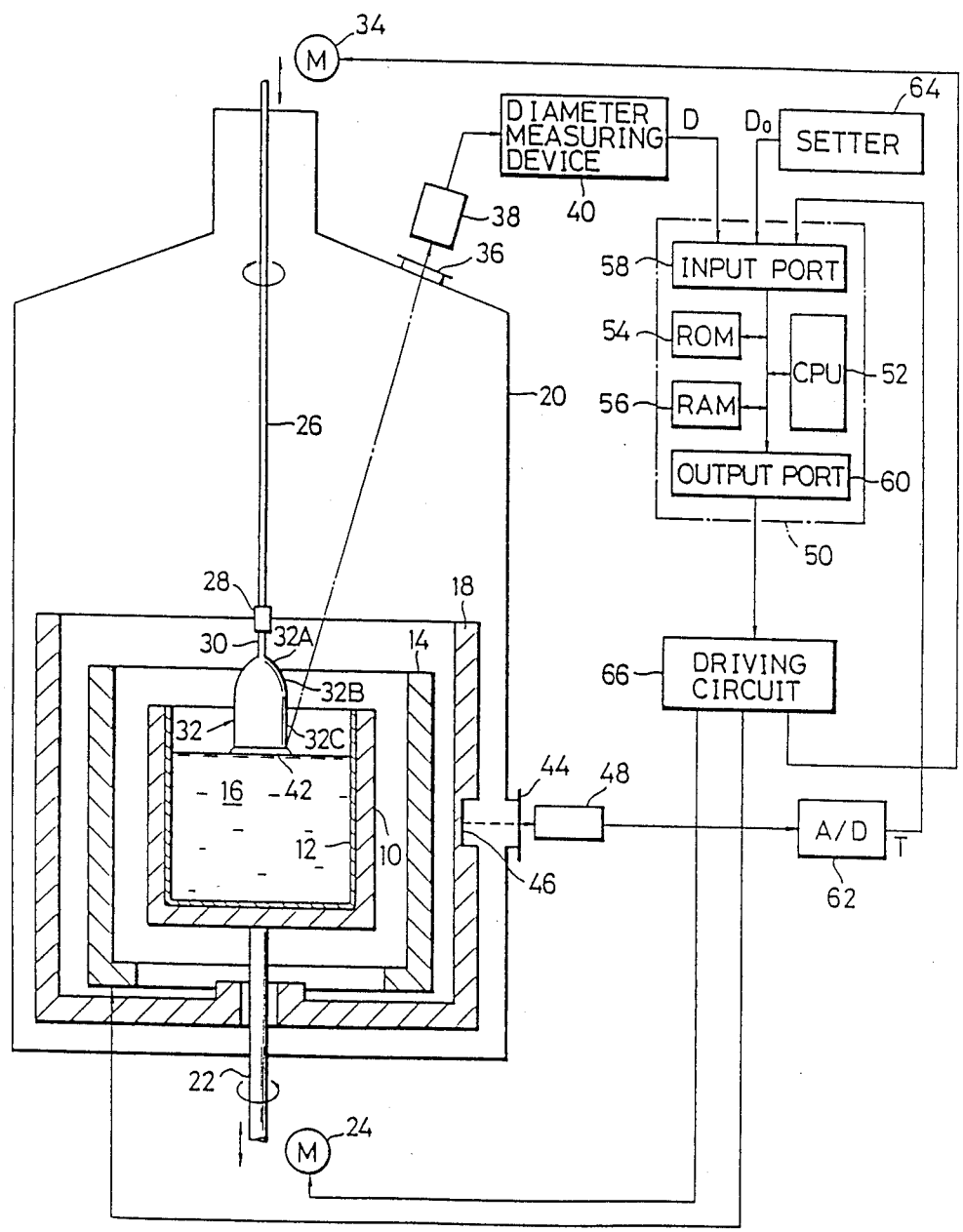
FIG. 1 shows a crystal growing apparatus to which an embodiment of the present invention is applied.

Referring first to FIG. 1, a quartz crucible 12 fitted into a graphite susceptor 10 contains silicon in the form of a melt 16, the polycrystalline silicon being melted by the superheating with a heater 14 which surrounds the graphite susceptor 10. The heater 14 is in turn enclosed by a heat insulating material 18. All of these units are contained in a vessel 20 filled with argon.

The susceptor 10 and the crucible 12 are rotated by a motor 24 through a shaft 22.

A crystal-lifting shaft 26 hangs over the melt 16. A seed crystal 30 is provided on the lower end of the shaft 26 in a seed holder 28. The lower end of the seed crystal 30 is immersed in the melt 16 by lowering the shaft 26. A crystal 32 is pulled upward through stages in the order of a narrowed portion, a tapered portion 32A, a shoulder portion 32B (which refers especially to a transition as), and a body portion 32C thereof as the shaft 26 is gradually pulled up by a motor 34. The shaft 26 and the shaft 22 coincide with the axis of rotational symmetry of the quartz crucible 12.

For the purpose of simplification, a motor for rotating the crystal-lifting shaft 26 and a motor for moving the shaft 22 up and down are not shown in FIG. 1.

An industrial TV camera 38 is provided in such a manner as to face a glass window 36 provided at the upper portion of the vessel 20. Video signals of the TV camera 38 are supplied to a diameter measuring device 40 which measures the diameter of a luminous ring 42 formed at the interface between the single crystal 32 and the melt 16; the diameter of the ring 42 relates to that of the single crystal 32 at the interface thereof with the melt 16.

A radiation thermometer 48 is disposed in such a manner as to face another glass window 44 provided at the lower side surface of the vessel 20 so as to enable the temperature of a recessed portion 46 formed in the side of the heat insulating material 18, hence the temperature of the melt 16, to be detected.

Control of the diameter of the crystal is performed by using a microcomputer 50. The microcomputer 50 includes a central processing unit 52, a read only memory 54, a random access memory 56, an input port 58, and an output port 60. The central processing unit 52 reads through the input port 58 diameter D of the single crystal 32 from the diameter measuring device 40 in accordance with the program stored in the read only memory 54. The central processing unit 52 also indirectly reads temperature T of the melt 16 from an A/D converter 62, as well as object diameter $D_0$ of the body portion 32 set by a setter 64.

Figure 3:
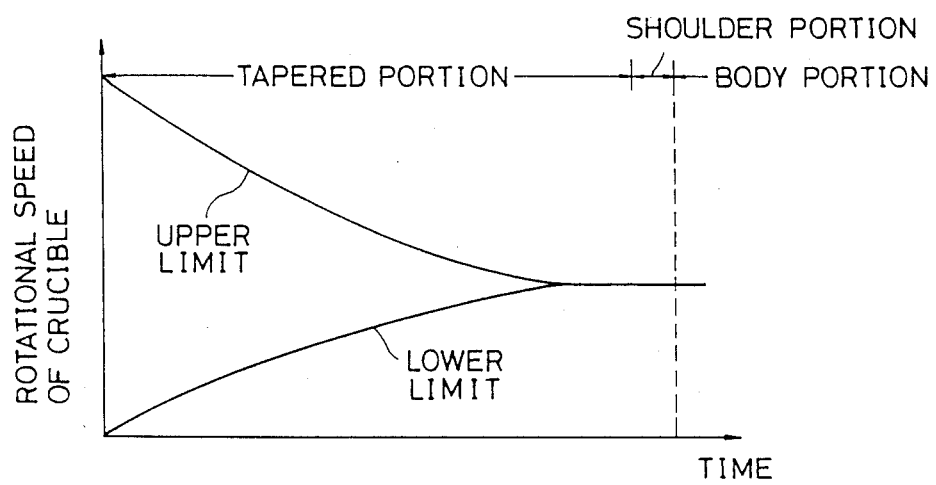
FIG. 3 is a graph showing the upper and lower limits of the rotational speed of a crucible with respect to the time.

The read only memory 54 contains an equation which is used to calculate the desired value of the rate of change of the diameter of the conical portion 32A of the single crystal 32. A unspecified constant contained in that equation is determined by using the desired diameter $D_0$. The read only memory 54 also contains equations used to calculate the upper and lower limits of the rotational speed of the crucible, such as those shown in FIG. 3, which in another case are predetermined 8 rpm for the lower and 12 rpm for the upper, and in still another 0.5 and 4 rpm, respectively, and so forth. The abscissa of the graph in FIG. 3 represents the time which has elapsed after the tapered portion starts to grow. As the time elapses, the upper and lower limits converge on the desired value (fixed) of the rotational speed of the crucible which is to be attained just past the start of the body portion. The range between the upper and lower limits may be 30 and 0 r.p.m., preferably 30 and 5 r.p.m.

The central processing unit 52 calculates the level of power to be supplied to the heater 14 and the desired rotational speed of the motor 24 by using the equations stored in the read only memory 54 and by exchanging data with the random access memory 56, then outputs operational signals to the output port 60 so as to control the heater 14 and the motor 24 through a driving circuit 66.

During crystal growth, the rotational speed of the motor 34 is fixed at a given value.

When the rotational speed of the quartz crucible 12 increases, the temperature at the center of the top surface of the melt 16 becomes lower than that of the peripheral portion thereof, increasing the growth rate of the single crystal 32. Changes in the growth rate of the single crystal 32 respond to those in the rotational speed of the quartz crucible 12 relatively quickly (within about one minute), whereas they respond to those in the power supplied to the heater 14 relatively slowly (within about 10 to 15 minutes). Since the amount of oxygen taken into the single crystal 32 as a solute depends on the rotational speed of the quartz crucible 12, it must be fixed at a certain value throughout the growth of the body portion 34C to keep constant in the concentration. Therefore, only when the diameter of the tapered portion 32A is still small at starting stage, control of the crystal diameter can be fully adjusted by control of the rotation of the quartz crucible 12. As the diameter of the tapered portion 32A approaches closer to that of the body portion 32C, control of the diameter of the crystal should be mainly adjusted by the pulling speed of the shaft 26 with the aid of the heating control of the heater 14. This enables the tapered portion 32A, which is discarded as a waste, to be reduced in the volume, and guarantees a superiority in crystallinity of the body portion which follows that of the tapered portion.

Figure 2:
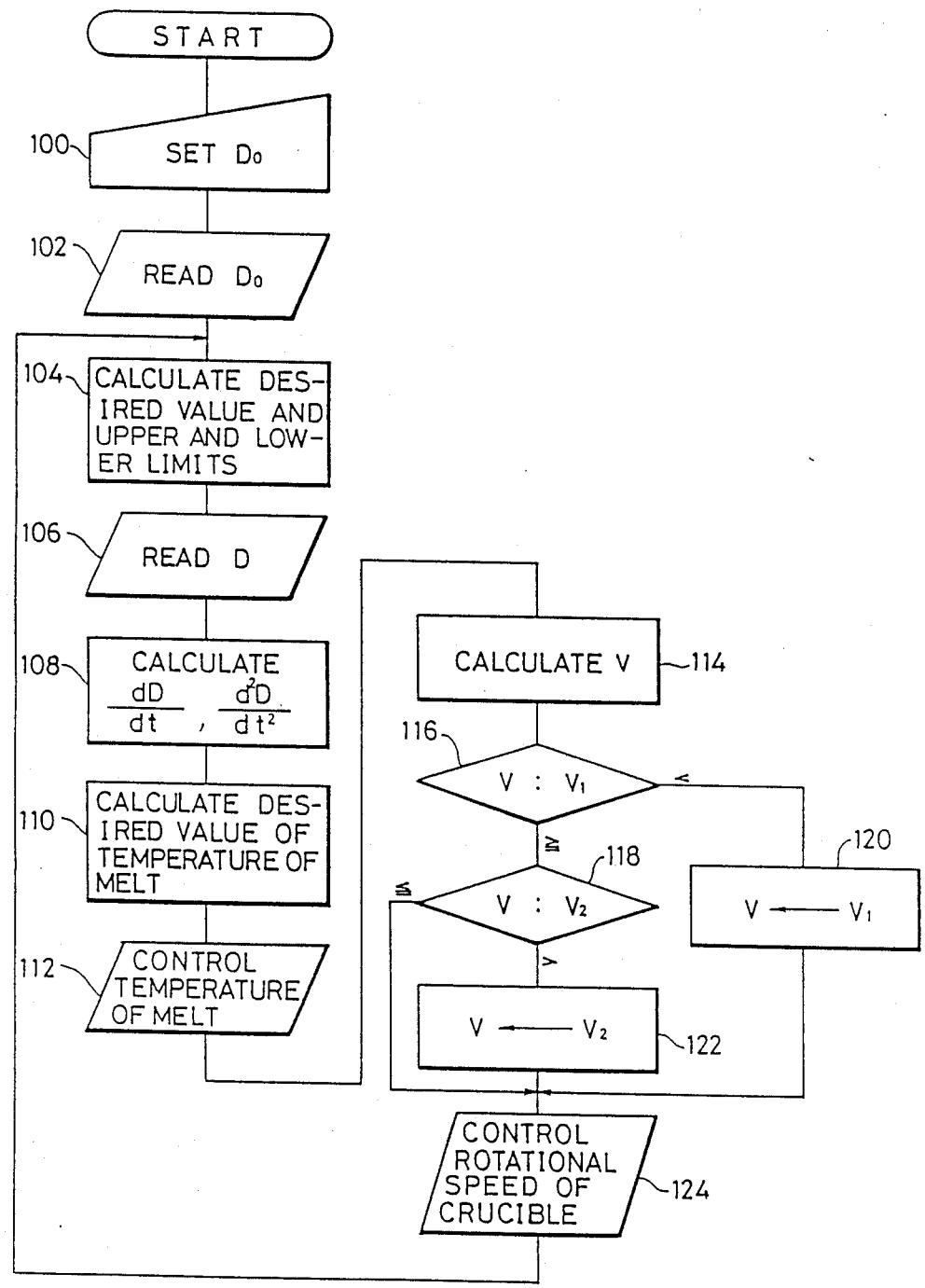
FIG. 2 is a flowchart of the software of a microcomputer 50 of FIG. 1.

The software structure of the microcomputer 50 will be described below with reference to FIG. 2 which is a flowchart of a tapered portion process which corresponds to the program stored in the read only memory 54.

First, the desired value $D_0$ of the diameter of the body portion is set by operating the setting device 64 in step 100. Next, in step 102, this desired value $D_0$ is read and stored in the random access memory 56, then the desired value of the rate of change in the diameter of the crystal as well as the upper and lower limits $V_2$ and $V_1$ of the rotational speed of the crucible are calculated by using the equations stored in the read only memory 54 in step 104.

In step 106, the diameter D of the crystal is read into the random access memory 56 from the diameter measuring device 40 through the input port 58.

In step 108, the first and second differential coefficients of the diameter D of the crystal are calculated using the diameters D of the crystal which have been written this time, the preceding time, and the time before the preceding time.

Next, in step 110, the manipulated variable of the proportional (p) plus derivative (D) action is calculated using the values obtained in the steps of 104 and 108, then the desired value of the temperature of the melt is calculated in accordance with the thus-obtained value, i.e., calculations are set in cascade fashion.

Thereafter, the temperature T of the melt 16 is read indirectly from the A/D converter 62, then it is adjusted so that it becomes identical to the desired value thereof by supplying power to the heater 14 in step 112.

In step 114, the manipulated variable of the proportional action is calculated by using the values obtained in steps 104 and 108, then the desired value V of the rotational speed of the crucible is calculated in accordance with the thus-obtained value, i.e., the calculations are set in cascade fashion. Next, this desired value V is corrected in the manner described below.

If $V_1 \leq V \leq V_2$, the flow proceeds to steps 116, 118, then 124. If $V < V_1$, V is set to $V_1$ in steps 116 and 120, then the flow goes to step 124. If $V > V_2$, V is set to $V_2$ in steps 116, 118, and 122, then the flow goes to step 124.

In step 124, the motor 24 is driven in such a manner that the rotational speed of the quartz crucible becomes equal to the desired value V.

The flow then returns to step 104 so as to repeat the above-described processing.

The present invention is not limited to the example decribed above, but various modifications and alterations including the ones described below are possible.

In the processing of step 110, the ratio of the quantity of control applied to the temperature of the melt to that applied to the rotational speed of the crucible may be further increased over that in the above-described embodiment as the diameter of the tapered portion becomes closer to that of the body portion by multiplying the variance of the obtained desired value of the temperature of the melt by a coefficient which gradually becomes larger as the upper and lower limits of the rotational speed of the crucible converge on the predetermined value, and which becomes 1 when they have converged to thereby correct this desired value.

The abscissa of the graph in FIG. 3 may represent either the detected diameter of the growing crystal or the ratio thereof to the desired diameter of the body portion instead of the time.

In the above-described embodiment, the upper and lower limits of the rotational speed of the crucible converge on a predetermined value as the diameter of the tapered portion becomes closer to that of the body portion. However, control may be performed in any way so long as the control range of the rotational speed of the crucible becomes narrower as the diameter of the growing crystal becomes closer to that of the body portion. For example, control may be arranged such that the proportional gain obtained in the proportional plus derivative action is made smaller as the diameter of the tapered portion becomes closer to that of the body portion. In this case, the proportional gain may be programmed as a function of elapsed time, as a function of the diameter of the growing crystal, or as a function of the ratio of the diameter of the growing crystal to that of the desired diameter of the body portion.

What is claimed is:

1. A method of controlling the diameter of a single crystal having a tapered portion and a cylindrical body portion produced by the Czochralski method from a melt in a crucible surrounded with a heater which is surrounded with a heat insulating material in order to reduce the volume of the tapered portion comprising:
   setting a desired diameter of a cylindrical body portion of the single crystal to be grown;
   measuring the diameter of the tapered portion of the growing crystal;
   measuring the temperature of the melt in the crucible;
   selecting a melt temperature based on a difference between the desired diameter of the growing single crystal and the measured diameter of the growing single crystal;
   controlling the temperature of the melt so that the measured melt temperature approaches the selected melt temperature;
   selecting a rotational speed of the crucible based on the difference between the desired diameter of the growing crystal and the measured diameter of the growing single crystal;
   correcting selected rotational speed of the crucible by limiting the selected rotational speed of the crucible within a range which converges to zero as the diameter of the growing single crystal approaches the desired diameter of the cylindrical body portion of the desired single crystal;
   and making the rotational speed of the crucible constant when the desired diameter of the cylindrical body portion of the single crystal is reached thereby reducing the volume of the tapered portion of the single crystal.

2. A method according to claim 1, wherein the range of the rotational speed of the crucible is within 0 to 30 r.p.m.

3. A method according to claim 1, wherein an upper limit of the range of said speed decreases as the diameter of the single growing crystal becomes larger and a lower limit of the range of said speed increases as the diameter of the single growing crystal becomes larger.

4. A method according to claim 1, wherein the range of said speed is a function of elapsed time.

5. A method according to claim 1, wherein the range of said speed is a function of the measured diameter of the single growing crystal.

6. A method according to claim 1, wherein the range of said speed is a function of a ratio of the measured diameter of the single growing crystal to a desired diameter of a cylindrical body portion of the single crystal.

7. A method according to claim 1, wherein the temperature of the melt is measured by indirectly measuring a temperature of a thin portion of the heat insulating material which encloses the heater for said melt.

* * * * *